US012635293B2

(12) United States Patent
Feng et al.

(10) Patent No.: US 12,635,293 B2
(45) Date of Patent: May 19, 2026

(54) LIGHT-EMITTING DEVICE

(71) Applicant: Quanzhou Sanan Semiconductor Technology Co., Ltd., Quanzhou (CN)

(72) Inventors: Yanbin Feng, Xiamen (CN); Wenhao Gao, Xiamen (CN); Qian Liang, Xiamen (CN); Chaoyu Wu, Xiamen (CN)

(73) Assignee: Quanzhou Sanan Semiconductor Technology Co., Ltd., Quanzhou (CN)

( * ) Notice: Subject to any disclaimer, the term of this patent is extended or adjusted under 35 U.S.C. 154(b) by 811 days.

(21) Appl. No.: 17/976,026

(22) Filed: Oct. 28, 2022

(65) Prior Publication Data

US 2023/0178685 A1     Jun. 8, 2023

(30) Foreign Application Priority Data

Dec. 2, 2021     (CN) .......................... 202111464356.7

(51) Int. Cl.
*H10H 20/816*     (2025.01)
*H10H 20/824*     (2025.01)

(52) U.S. Cl.
CPC ........ *H10H 20/816* (2025.01); *H10H 20/824* (2025.01)

(58) Field of Classification Search
CPC .. H10H 20/816; H10H 20/824; H10H 20/822; H10H 20/815; H10H 20/013
See application file for complete search history.

(56) References Cited

U.S. PATENT DOCUMENTS

| | | | |
|---|---|---|---|
| 7,244,630 B2 * | 7/2007 | Krames ................ | H10H 20/824 438/94 |
| 2006/0071232 A1 * | 4/2006 | Sasakura ................ | H10H 20/81 257/103 |

(Continued)

FOREIGN PATENT DOCUMENTS

| | | |
|---|---|---|
| CN | 105845793 A | 8/2016 |
| CN | 105870227 A | 8/2016 |
| CN | 113161458 A | 7/2021 |

OTHER PUBLICATIONS

Search Report appended to an Office Action, which was issued to Chinese counterpart application No. 202111464356.7 by the CNIPA on Jun. 1, 2023, with an English translation thereof; pp. 1-6.

*Primary Examiner* — Thanh T Nguyen
(74) *Attorney, Agent, or Firm* — Muncy, Geissler, Olds & Lowe, P.C.

(57)     ABSTRACT
A light-emitting device includes a semiconductor epitaxial structure that has a first surface and a second surface, and that includes a first current spreading layer, a $In_{x1}Ga_{1-x1}As$ layer, a first cladding layer, an active layer and a second cladding layer disposed sequentially in such order from the first surface to the second surface, wherein, in the $In_{x1}Ga_{1-x1}As$ layer, $0<x1\leq0.08$. In another aspect of the disclosure, the first current spreading layer is made of gallium arsenide, and has a thickness ranging from 2 μm to 10 μm and a doping concentration ranging from $1E17/cm^3$ to $4E18/cm^3$. In yet another aspect of the disclosure, a layered stack is disposed between the first current spreading layer and the first cladding layer, and includes an $In_{x3}Ga_{1-x3}As$ layer and an $Al_{y3}Ga_{1-y3}As_zP_{1-z}$ layer, in which $0.02<x3\leq0.20$, $0\leq y3\leq0.25$, and $0.7<z\leq0.95$.

19 Claims, 7 Drawing Sheets

(56) References Cited

U.S. PATENT DOCUMENTS

| | | |
|---|---|---|
| 2006/0220031 A1 | 10/2006 | Krames et al. |
| 2018/0138371 A1* | 5/2018 | Wu ........................ H10H 20/01 |

* cited by examiner 110
109
111
111a
108
107
106
105
105a
104
103
102
101
100

LIGHT-EMITTING DEVICE

CROSS-REFERENCE TO RELATED APPLICATION

This application claims priority to Chinese Invention Patent Application No. 202111464356.7, filed on Dec. 2, 2021.

FIELD

The disclosure relates to a semiconductor device, and more particular to a light-emitting device.

BACKGROUND

Light-emitting diodes (LEDs) are considered to be one of the light sources having the most potential as they offer advantages including high luminous intensity, high efficiency, small size, and long lifespan. In particular, infrared light-emitting diodes (IR LEDs) are widely applied in various fields, such as security surveillance systems, wearable devices, space communication systems, remote control, medical appliances, light sources of sensors, night lighting systems, etc., for having advantageous characteristics, e.g., specific waveband, low power consumption, and high reliability.

Currently available invisible light LED devices have a phenomenon of red burst. That is to say, a deep red light visible to the human eyes is emitted from the LED device when the LED device is lit. This phenomenon has placed limitations on applications of the invisible light LED devices. As a result, an invisible light LED device without the visible red burst needs to be developed for this need.

SUMMARY

Therefore, an object of the disclosure is to provide an invisible light light-emitting device that can alleviate the occurrence of red burst in the prior art.

According to a first aspect of the disclosure, the light-emitting device includes a semiconductor epitaxial structure that has a first surface and a second surface opposite to the first surface, and that includes a first current spreading layer, a first $In_{x1}Ga_{1-x1}As$ layer, a first cladding layer, an active layer and a second cladding layer disposed sequentially in such order from the first surface to the second surface, wherein, in the first $In_{x1}Ga_{1-x1}As$ layer, $0<x1\leq0.08$.

According to a second aspect of the disclosure, the light-emitting device includes a semiconductor epitaxial structure that has a first surface and a second surface opposite to the first surface, and that includes a first current spreading layer, a first cladding layer, an active layer and a second cladding layer disposed sequentially in such order from the first surface to the second surface, wherein the first current spreading layer is made of gallium arsenide, has a thickness ranging from 2 μm to 10 μm, and has a doping concentration ranging from $1E17/cm^3$ to $4E18/cm^3$.

According to a third aspect of the disclosure, the light-emitting device includes a semiconductor epitaxial structure that has a first surface and a second surface opposite to the first surface, and that includes a first current spreading layer, a layered stack, a first cladding layer, an active layer and a second cladding layer disposed sequentially in such order from the first surface to the second surface, wherein the layered stack includes an $In_{x3}Ga_{1-x3}As$ layer and an $Al_{y3}Ga_{1-y3}As_zP_{1-z}$ layer, in which $0.02<x_3\leq0.20$, $0\leq y_3\leq0.25$, and $0.7<z\leq0.95$.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
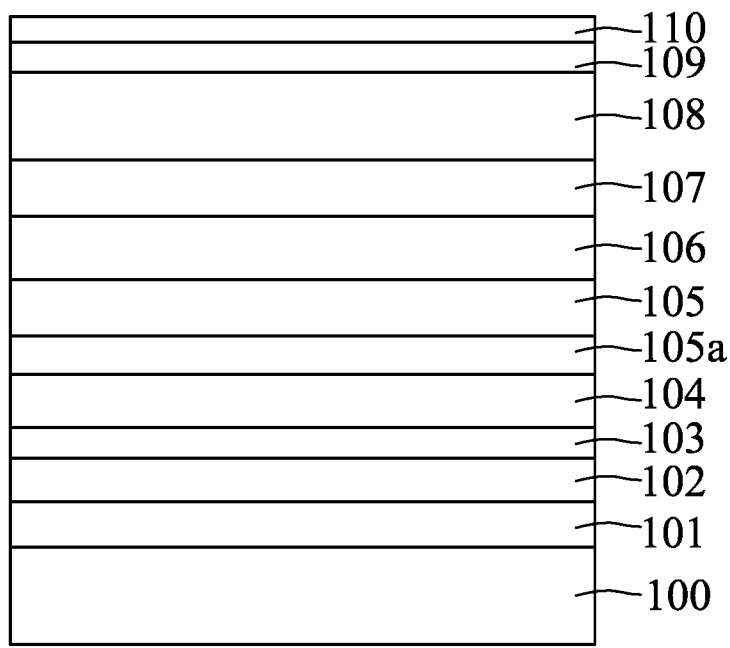
FIG. 1 is a schematic view illustrating a semiconductor epitaxial structure of a first embodiment of a light-emitting device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, a semiconductor epitaxial unit of a first embodiment of a light-emitting device according to the disclosure includes a growth substrate 100, and a semiconductor epitaxial structure that includes a first current spreading layer 104, a first indium-containing transition layer 105a, a first $In_{x1}Ga_{1-x1}As$ layer 105, a first cladding layer 106, an active layer 107, a second cladding layer 108, a second current spreading layer 109, and a second ohmic contact layer 110 disposed sequentially in such order on the growth substrate 100.

The growth substrate 100 may be made of gallium arsenide, gallium phosphide or indium phosphide, but is not limited to. In this embodiment, the growth substrate is made of gallium arsenide. As shown in FIG. 1, the light-emitting device may further include a buffer layer 101, an etch stop layer 102, and a first ohmic contact layer 103 disposed sequentially in such order on the growth substrate 100 and located between the growth substrate 100 and the first current spreading layer 104. Because the quality of lattice of the buffer layer 101 is better than that of the growth substrate 100, forming the buffer layer 101 on the growth substrate 100 may alleviate adverse effects of the lattice defects of the growth substrate 100 on the semiconductor epitaxial structure. The etch stop layer 102 serves to stop chemical etching in subsequent procedures. In certain embodiments, the etch stop layer 102 is an n-type etch stop layer made of n-type gallium indium phosphide. To facilitate removal of the growth substrate 100 in subsequent procedures, the etch stop layer 102 has a thickness that is no greater than 500 nm. In some embodiments, the thickness of the etch stop layer 102 is no greater than 200 nm. The first ohmic contact layer 103 may be made of gallium arsenide, and may have a thickness ranging from 10 nm to 100 nm and a doping concentration ranging from $1E18/cm^3$ to $10E18/cm^3$. In some embodiments, the doping concentration of the first ohmic contact layer 103 is $2E18/cm^3$ so as to achieve better ohmic contact.

The semiconductor epitaxial structure may be formed on the growth substrate 100 by using methods such as physical vapor deposition (PVD), chemical vapor deposition (CVD), epitaxy growth technology, atomic layer deposition (ALD), etc.

The semiconductor epitaxial structure may contain a semiconductor material that generates light, such as ultra-violet light, blue light, green light, yellow light, red light, and infrared light. Specifically, the semiconductor material of the semiconductor epitaxial structure may be a material that generates a peak wavelength ranging from 200 nm to 950 nm, such as a nitride material. In certain embodiments, the semiconductor epitaxial structure may be a GaN-based laminate that may be doped with aluminum, indium, etc., but is not limited to, and that generates light having a wavelength ranging from 200 nm to 500 nm. In certain embodiments, the semiconductor epitaxial structure may be an AlGaInP-based laminate or an AlGaAs-based laminate that generates light having a peak wavelength ranging from 550 nm to 950 nm. In this embodiment, the semiconductor epitaxial structure is an AlGaAs-based laminate and generates invisible light having a peak wavelength ranging from 910 nm to 980 nm.

The first current spreading layer 104 performs a function of current spreading, and the effectiveness of the current spreading function is related to a thickness of the first current spreading layer 104. In this embodiment, the thickness of the first current spreading layer 104 may vary based on the size of the light-emitting device. In some embodiments, the thickness of the first current spreading layer 104 ranges between 2 μm to 10 μm. In this embodiment, the thickness of the first current spreading layer 104 ranges from 5 μm to 9 μm, which ensures an even current distribution. The first current spreading layer 104 has a composition that is represented by $Al_{y1}Ga_{1-y1}As$ with $0 \leq y_1 \leq 0.25$, and has a doping concentration ranging from $1E17/cm^3$ to $4E18/cm^3$. In some embodiments, the first current spreading layer 104 is made of gallium arsenide. Since a bandgap of gallium arsenide is 1.42 eV, it may absorb light having a peak wavelength no greater than 870 nm. As a result, when the first current spreading layer 104 is made of gallium arsenide, it may absorb some visible light and resolve the issue of red burst in the light-emitting device.

In certain embodiments, the first current spreading layer 104 has a composition that is represented by $Al_{y1}Ga_{1-y1}As$ with $0 < y_1 \leq 0.25$. In other embodiments, $y_1$ is $0 < y_1 \leq 0.1$, which may absorb some visible light and resolve the issue of red burst in the light-emitting device.

To resolve the issue of red burst in the light-emitting device more effectively, in this embodiment, a first $In_{x1}Ga_{1-x1}As$ layer 105 is disposed between the first current spreading layer 104 and the first cladding layer 106. In the first $In_{x1}Ga_{1-x1}As$ layer 105, the value of $x_1$ may be greater than 0 and no greater than 0.08 (i.e. $0 < x_1 \leq 0.08$). In some embodiments, the first $In_{x1}Ga_{1-x1}As$ layer 105 has a thickness ranging between 100 nm to 1000 nm, and may also be no smaller than 200 nm. The first $In_{x1}Ga_{1-x1}As$ layer 105 with thickness in this range may absorb visible light and resolve the issue of red burst in the light-emitting device more effectively. The first $In_{x1}Ga_{1-x1}As$ layer 105 has a doping concentration ranging from $1E17/cm^3$ to $4E18/cm^3$. In this embodiment, the first $In_{x1}Ga_{1-x1}As$ layer 105 absorbs visible light having a peak wavelength no greater than 890 nm and resolves the issue of red burst in the light-emitting device.

Due to lattice mismatch between the first $In_{x1}Ga_{1-x1}As$ layer 105 and the growth substrate 100, stress exists during the growth of the epitaxial layers and in turn affects the quality of the semiconductor epitaxial structure. Referring to FIG. 1, in this embodiment, the first indium-containing transition layer 105a is disposed between the first current spreading layer 104 and the first $In_{x1}Ga_{1-x1}As$ layer 105, which may reduce stress between the first $In_{x1}Ga_{1-x1}As$ layer 105 and the growth substrate 100 resulted from lattice mismatch, improve the quality of the semiconductor epitaxial structure, and improve optoelectronic properties of the light-emitting device. An indium content of the first indium-containing transition layer 105a increases gradually in a direction (i.e., a thickness direction) from the first current spreading layer 104 to the first $In_{x1}Ga_{1-x1}As$ layer 105.

Figure 2:
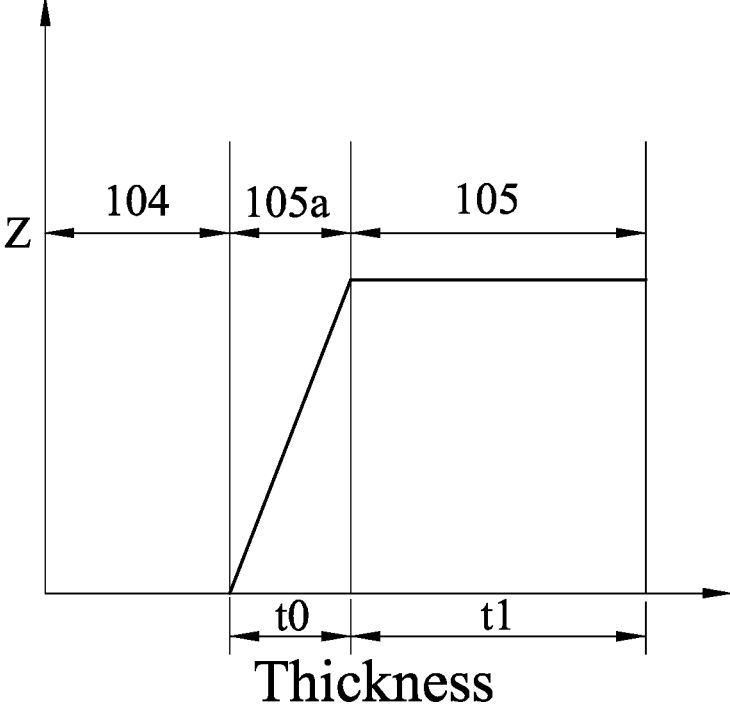
FIG. 2 and FIG. 3 are graphs illustrating an indium content of a first indium-containing transition layer of the first embodiment.
Figure 3:
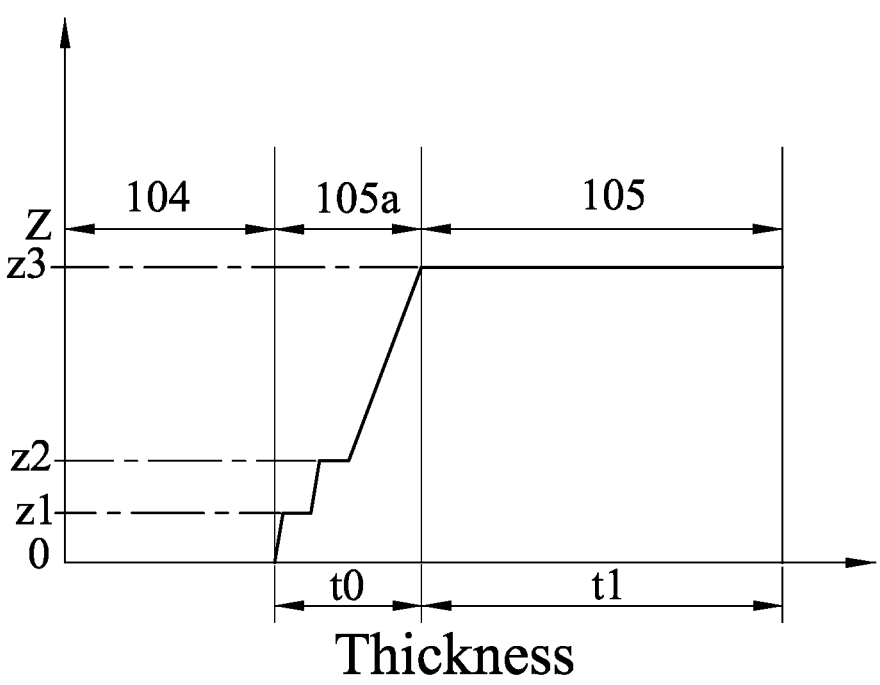

In certain embodiments, the indium content of the first indium-containing transition layer 105a increases along the thickness direction in a linear or stepwise manner. Specifically, FIG. 2 demonstrates the indium content of the first indium-containing transition layer 105a increasing in a linear manner, wherein the first indium-containing transition layer 105a has a thickness of to and may be viewed as a single layer that has the indium content increasing along the thickness direction linearly. On the other hand, FIG. 3 demonstrates the indium content of the first indium-containing transition layer 105a increasing in a stepwise manner, wherein the first indium-containing transition layer 105a may be multi-layered such as having at least two or more layers. In certain embodiments, the first indium-containing transition layer 105a has a first, second, third, fourth, fifth . . . , and $n^{th}$ sublayer, where n is greater than or equal to 3. Each sublayer may be an $In_zGa_{1-z}As$ layer. In this embodiment, the value of z of the first sublayer increases linearly from 0 to $z_1$, and the value of z of the second sublayer equals to $z_1$; the value of z of the third sublayer increases linearly from $z_1$ to $z_2$, and the value of z of the fourth sublayer equals to $z_2$; the value of z of the fifth sublayer increases linearly from $z_2$ to $z_3$, and $z_3$ equals to $x_1$.

To form the first indium-containing transition layer 105a with the gradually increased indium content, during formation of the $In_zGa_{1-z}As$ layer, a supply rate of indium may be increased in a linear or stepwise manner. In an embodiment, in the $In_zGa_{1-z}As$ layer, z is increased from 0 to 0.08.

In certain embodiments, a third indium-containing transition layer (not shown) is disposed between the first $In_{x1}Ga_{1-x1}As$ layer 105 and the first cladding layer 106. An indium content of the third indium-containing layer decreases gradually in a direction from the first $In_{x1}Ga_{1-x1}As$ layer 105 to the first cladding layer 106. In other embodiments, the indium content of the third indium-containing layer decreases along the thickness direction in a linear or stepwise manner.

In the semiconductor epitaxial structure, the first cladding layer 106 and the second cladding layer 108 have different doped types. By using appropriate dopants, the first cladding layer 106 and the second cladding layer 108 may be respectively n-type doped and p-type doped. In this embodiment, the first cladding layer 106 is an n-type layer that provides electrons. The second cladding layer 108 is a p-type layer that provides holes. A bandgap of the first cladding layer 106 and a bandgap of the second cladding layer 108 are both greater than a bandgap of the active layer 107. The first cladding layer 106 may be doped with silicon or tellurium to become an n-type doped layer. The second cladding layer 108 may be doped with carbon or magnesium to become a p-type doped layer.

The active layer 107 is a region where the electrons and holes recombine to emit light. Depending on a wavelength of light that is to be emitted from the active layer 107, materials for the active layer 107 may vary. The active layer 107 may be a single quantum well or multiple quantum wells with a periodic structure. The active layer 107 includes a well layer and a barrier layer, and a bandgap of the barrier layer is greater than that of the well layer. By adjusting a composition of the semiconductor material of the active layer 107, a pre-determined wavelength of light may be emitted from the active layer 107. The active layer 107 is a layer of electroluminescent material, such as InGaAs or AlGaAs. In some embodiments, the active layer 107 is made of indium gallium arsenide with a single quantum well or multiple quantum wells. In this embodiment, the semiconductor epitaxial structure emits an infrared light.

The second current spreading layer 109 performs a function of current spreading, and the effectiveness of the current spreading function is related to a thickness of the second current spreading layer 109. The thickness of the second current spreading layer 109 may be greater than 0 μm and no greater than 3 μm so as to ensure an even current distribution. The second current spreading layer 109 has a composition that is represented by $Al_{y2}Ga_{1-y2}As$ with $0 \leq y_2 \leq 0.25$. The second current spreading layer 109 is p-type doped and has a doping concentration ranging from $1E17/cm^3$ to $4E18/cm^3$.

In some embodiments, the second current spreading layer 109 is made of gallium arsenide. Since a bandgap of gallium arsenide is 1.42 eV, it may absorb light having a peak wavelength no greater than 870 nm. As a result, when the second current spreading layer 109 is made of gallium arsenide, it may absorb some visible light and resolve the issue of red burst in the light-emitting device.

In certain embodiments, the second current spreading layer 109 has a composition that is represented by $Al_{y2}Ga_{1-y2}As$ with $0 < y_2 \leq 0.25$. In other embodiments, $y_2$ is $0 < y_2 \leq 0.1$, which may absorb some visible light and resolve the issue of red burst in the light-emitting device.

Figure 4:
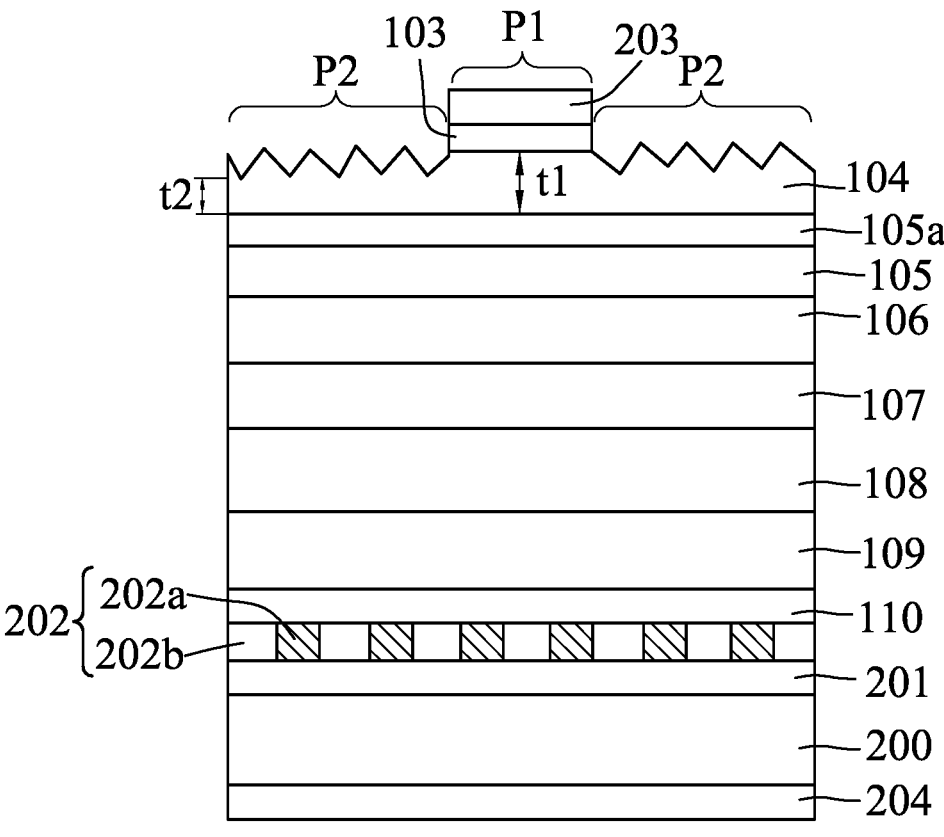
FIG. 4 is a schematic view illustrating a first embodiment of a light-emitting device according to the disclosure.

A second ohmic contact layer 110 is used to form an ohmic contact with a second electrode 204 as shown in FIG. 4. In some embodiments, the second ohmic contact layer 110 is made of gallium phosphide and has a doping concentration of $5E18/cm^3$. When the doping concentration of the second ohmic contact layer 110 is no smaller than $1E19/cm^3$, a better ohmic contact may be achieved. The second ohmic contact layer 110 shown in FIG. 1 may also have a thickness ranging from 30 nm to 100 nm. In this embodiment, the second ohmic contact layer 110 has a thickness of 50 nm.

Referring to FIG. 4, a first embodiment of a light-emitting device according to the disclosure adopts the semiconductor epitaxial structure as shown in FIG. 1. The light-emitting device includes a substrate 200, the semiconductor epitaxial structure, and a bonding layer 201 bonding the semiconductor epitaxial structure to the substrate 200. The semiconductor epitaxial structure includes the second ohmic contact layer 110, the second current spreading layer 109, the second cladding layer 108, the active layer 107, the first cladding layer 106, the first $In_{x1}Ga_{1-x1}As$ layer 105, the first indium-containing transition layer 105a, the first current spreading layer 104, and the first ohmic contact layer 103 sequentially disposed on the substrate 200 in such order in a bottom-top direction.

The substrate 200 is a conductive substrate and may be made of silicon, silicon carbide or metal. Examples of the metal include copper, tungsten, molybdenum, etc. In some embodiments, the substrate 200 has a thickness no smaller than 50 μm so as to have sufficient mechanical strength to support the semiconductor epitaxial structure. In addition, to facilitate further mechanical processing of the substrate 200 after bonding the substrate 200 to the semiconductor epitaxial structure, the substrate 200 may have a thickness that is no greater than 300 μm. In this embodiment, the substrate 200 is a silicon substrate.

A first electrode 203 is disposed on the first ohmic contact layer 103. The first electrode 203 and the first ohmic contact layer 103 form an ohmic contact to allow an electric current to pass therethrough. During formation of the light-emitting device, the first ohmic contact layer 103 is etched to maintain a portion of the first ohmic contact layer 103 located right below the first electrode 203. The first current spreading layer 104 includes two portions in a horizontal direction perpendicular to the bottom-top direction: a first portion (P1) that is located right below the first ohmic contact layer 103 and the first electrode 203 (i.e., the portion covered by the first ohmic contact layer 103 and the first electrode 203), and a second portion (P2) that is not located right below the first electrode 203 (i.e., the portion not covered by the first ohmic contact layer 103 and the first electrode 203). The second portion (P2) has a light-exiting surface that is not covered by and exposed from the first ohmic contact layer 103 and the first electrode 203. The light-exiting surface may surround the first electrode 203 and be a patterned surface or a roughened surface; the patterned surface may be obtained via etching. The roughened surface may have a regular or an arbitrarily irregular micro/nanostructure. The light-exiting surface that is patterned or roughened facilitates an exit of light from the active layer 107, so as to increase the luminous efficiency of the light-emitting device. In some embodiments, the light-exiting surface is a roughened surface that has a roughened structure with a height difference (i.e., a peak-to-valley average difference) of less than 1 μm, e.g., from 10 nm to 300 nm.

Of the first current spreading layer 104, the first portion (P1) has a contact surface that is in contact with the first ohmic contact layer 103. The contact surface is not roughened because the contact surface is protected by the first electrode 203. The roughened surface of second portion (P2) of the first current spreading layer 104 is relatively lower than the contact surface of the first portion (P1) on a horizontal level.

Specifically, as shown in FIG. 4, in this embodiment, the first portion (P1) has a first thickness (t1), and the second portion (P2) has a second thickness (t2). In certain embodiments, the first thickness (t1) ranges from 1.5 μm to 2.5 μm, and the second thickness (t2) ranges from 0.5 μm to 1.5 μm.

The first thickness (t1) of the first portion (P1) is greater than the second thickness (t2) of the second portion (P2). In some embodiments, the first thickness (t1) is greater than the second thickness (t2) by at least 0.3 μm.

The light-emitting device may further include a mirror layer 202 that is disposed between the semiconductor epitaxial structure and the substrate 200. The mirror layer 202 includes a p-type ohmic contact metal layer 202a and a dielectric layer 202b. On one hand, the p-type ohmic contact metal layer 202a and the dielectric layer 202b cooperate with the second ohmic contact layer 110 to form an ohmic contact. On the other hand, the p-type ohmic contact metal layer 202a and the dielectric layer 202b reflect the light emitted from the active layer 107 toward the light-exiting surface of the first current spreading layer 104 or a side wall of the semiconductor epitaxial structure so as to facilitate the exit of light.

The second electrode 204 may be disposed on the substrate 200 at a side where the semiconductor epitaxial structure is disposed or at a side opposite to the semiconductor epitaxial structure.

Each of the first electrode 203 and the second electrode 204 may be made of a transparent conductive material or a metal material. The transparent conductive material may be indium tin oxide (ITO) or indium zinc oxide (IZO). The metal material may be at least one of GeAuNi, AuGe, AuZn, Au, Al, Pt, and Ti, and combinations thereof.

In this embodiment, GaAs and $In_{x1}Ga_{1-x1}As$ layers are used as absorption layers; particularly, the first current spreading layer 104 and the first $In_{x1}Ga_{1-x1}As$ layer 105 are used as absorption layers, which may effectively remove visible light such as the red burst when a current density in the light-emitting device is greater than 1 A/mm². Due to a relatively large lattice mismatch between the first $In_{x1}Ga_{1-x1}As$ layer 105 and the growth substrate 100, which may produce a significant stress during the growth of the epitaxial layers, the first indium-containing transition layer 105a is introduced to improve the crystal quality of the semiconductor epitaxial structure, and optoelectronic properties and reliability of the light-emitting device.

Figure 5:
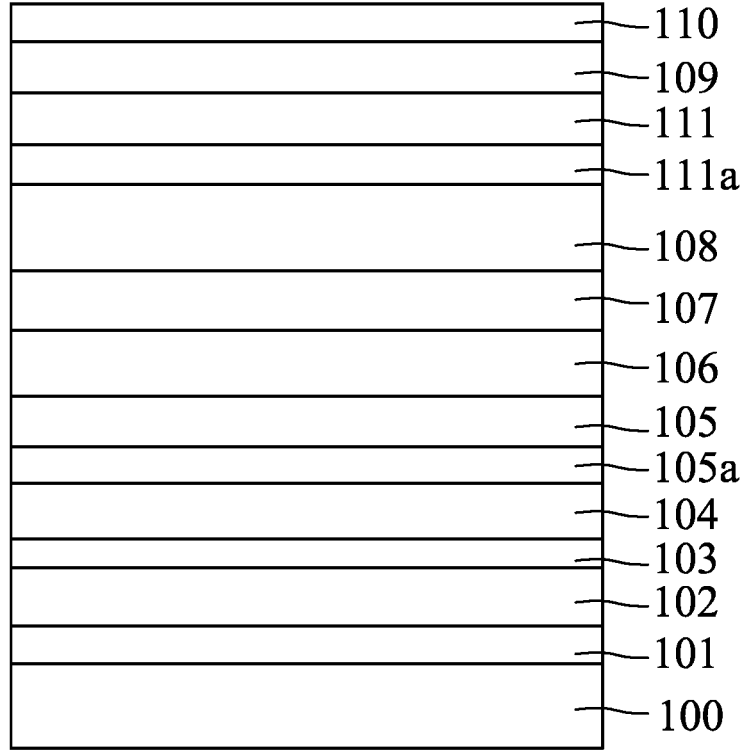
FIG. 5 is a schematic view illustrating the semiconductor epitaxial structure of a second embodiment of the light-emitting device according to the disclosure.

FIG. 5 illustrates a second embodiment of the semiconductor epitaxial structure according to the disclosure. The semiconductor epitaxial structure of the second embodiment illustrated by FIG. 5 differs from the semiconductor epitaxial structure of the first embodiment illustrated by FIG. 1 in that the semiconductor epitaxial structure of the second embodiment further includes a second $In_{x2}Ga_{1-x2}As$ layer 111 disposed between the second cladding layer 108 and the second current spreading layer 109. In the second $In_{x2}Ga_{1-x2}As$ layer 111, the value of $x_2$ (i.e., an indium content) may be greater than 0 and no greater than 0.08 (i.e., $0<x_2≤0.08$). In some embodiments, the second $In_{x2}Ga_{1-x2}As$ layer 111 has a thickness ranging from 100 nm to 1000 nm and a doping concentration ranging from 1E17/cm³ to 4E18/cm³. The second $In_{x2}Ga_{1-x2}As$ layer 111 may absorb visible light having a peak wavelength no greater than 890 nm, which may further resolve the issue of red burst in the light-emitting device.

To reduce stress resulted from lattice mismatch between the second $In_{x2}Ga_{1-x2}As$ layer 111 and the growth substrate 100, the second embodiment further includes a second indium-containing transition layer 111a disposed between the second cladding layer 108 and the second $In_{x2}Ga_{1-x2}As$ layer 111. The second indium-containing transition layer 111a may improve the quality of lattice of the semiconductor epitaxial structure and therefore improve optoelectronic properties of the light-emitting device. An indium content of the second indium-containing transition layer 111a increases in a direction from the second cladding layer 108 to the second $In_{x2}Ga_{1-x2}As$ layer 111. In some embodiments, the indium content of the second indium-containing transition layer 111a increases in the direction from the second cladding layer 108 to the second $In_{x2}Ga_{1-x2}As$ layer 111 in a linear manner, and a supply rate of indium may be increased in a linear manner during formation of the second indium-containing transition layer 111a. In other embodiments, the indium content of the second indium-containing transition layer 111a increases in the direction from the second cladding layer 108 to the second $In_{x2}Ga_{1-x2}As$ layer 111 in a stepwise manner.

In certain embodiments, a fourth indium-containing transition layer (not shown) is disposed between the second $In_{x2}Ga_{1-x2}As$ layer 111 and the second current spreading layer 109. An indium content of the fourth indium-containing layer decreases gradually in a direction from the second $In_{x2}Ga_{1-x2}As$ layer 111 to the second current spreading layer 109. In some embodiments, the indium content of the fourth indium-containing layer decreases along the thickness direction in a linear or stepwise manner.

Figure 6:
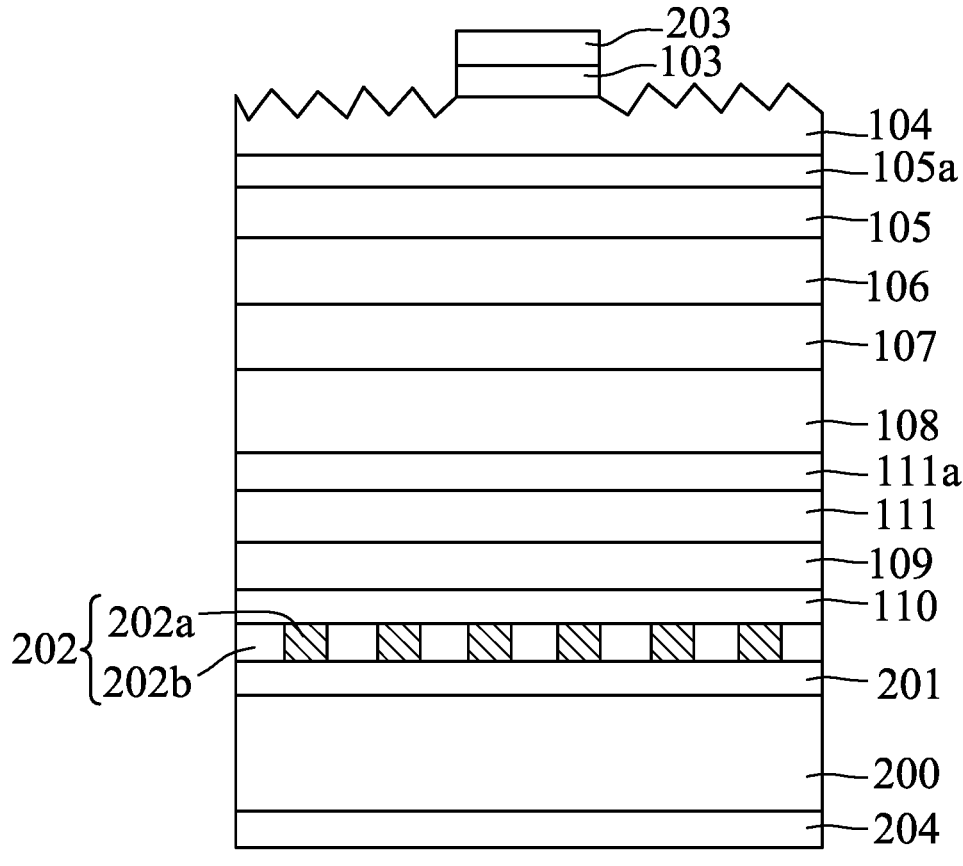
FIG. 6 is a schematic view illustrating a second embodiment of the light-emitting device according to the disclosure.

FIG. 6 illustrates a second embodiment of the light-emitting device according to the disclosure containing the semiconductor epitaxial structure as shown in FIG. 5. Similar to the first embodiment of the light-emitting device, the second embodiment of the light-emitting device also includes the substrate 200, the bonding layer 201, the mirror layer 202, the first electrode 203, and the second electrode 204. A production method of the light-emitting device is provided below.

First, referring to FIG. 5, the growth substrate 100 is provided and may be made of gallium arsenide. By using an epitaxy process, such as metal-organic chemical vapor deposition (MOCVD), the semiconductor epitaxial structure is grown on the growth substrate 100. The semiconductor epitaxial structure includes the buffer layer 101, the etch stop layer 102 for removing the growth substrate 100, the first ohmic contact layer 103, the first current spreading layer 104, the first indium-containing transition layer 105a, the first $In_{x1}Ga_{1-x1}As$ layer 105, the first cladding layer 106, the active layer 107, the second cladding layer 108, the second indium-containing transition layer 111a, the second $In_{x2}Ga_{1-x2}As$ layer 111, the second current spreading layer 109 and the second ohmic contact layer 110 sequentially disposed in such order on the growth substrate 100.

Figure 7:
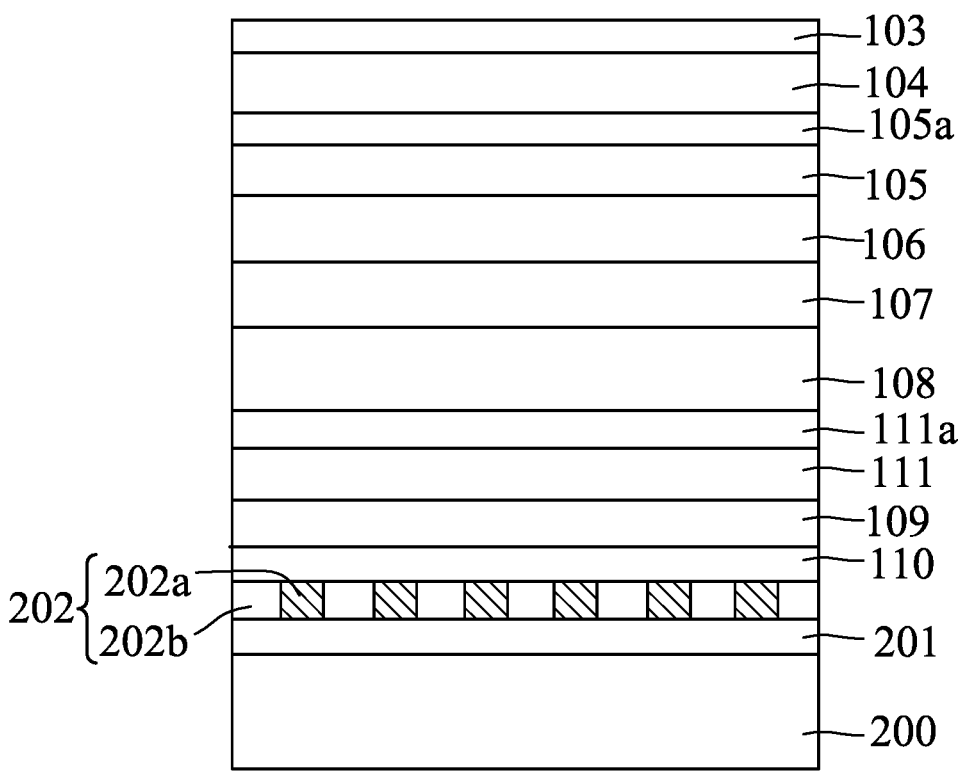
FIG. 7 and FIG. 8 are schematic views illustrating a production method of the light-emitting device shown in FIG. 6.

Next, the semiconductor epitaxial structure is transferred to the substrate 200 and the growth substrate 100 is removed to obtain a structure as shown in FIG. 7. The steps include: forming the mirror layer 202 on the second ohmic contact layer 110 opposite to the second current spreading layer 109, where the mirror layer 202 includes the p-type ohmic contact metal layer 202a and the dielectric layer 202b; providing the substrate 200; disposing the bonding layer 201 on the substrate 200; bonding the substrate 200 with the mirror layer 202 through the bonding layer 201; and removing the growth substrate 100. In cases where the growth substrate 100 is made of gallium arsenide, the growth substrate may be removed by wet etching until the first ohmic contact layer 103 is revealed.

Figure 8:
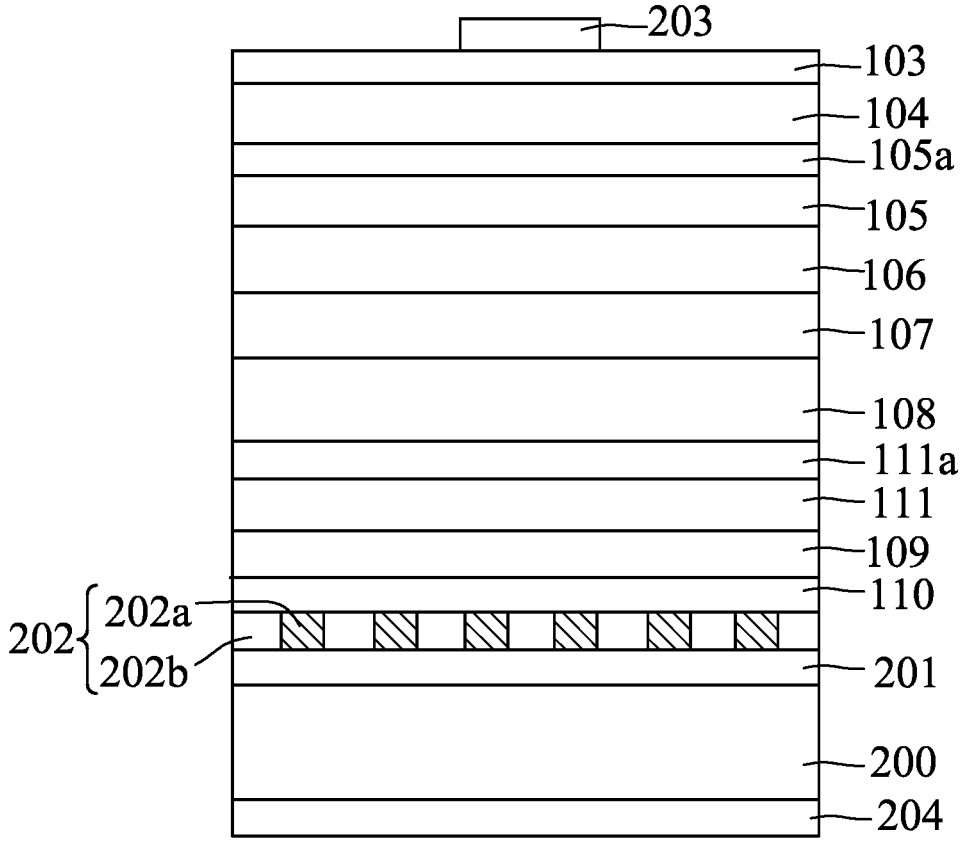

Next, referring to FIG. 8, the first electrode 203 is formed on the first ohmic contact layer 103, and the second electrode 204 is formed on the substrate 200 opposite to the semiconductor epitaxial structure. A good ohmic contact is then established between the first electrode 203 and the first ohmic contact layer 103. Accordingly, an electric current may flow between the first electrode 203 and the second electrode 204 through the semiconductor epitaxial structure. In addition, the substrate 200 has a pre-determined thickness that is capable of supporting the semiconductor epitaxial structure.

Then, a mask (not shown) is formed to cover the first electrode 203, and a portion of the first ohmic contact layer 103 that is not covered by and surrounds the first electrode 203 is left exposed. Next, etching is performed to remove the portion of the first ohmic contact layer 103 that is left exposed, so that the first current spreading layer 104 is revealed. Afterwards, the first current spreading layer 104 is etched to form a patterned or roughened surface as shown in FIG. 6. It should be noted that the removal of the first ohmic contact layer 103 and the roughening of the first current spreading layer 104 may be conducted by wet etching in one step or multiple steps. Solutions used for wet etching may be acidic, such as hydrochloric acid, sulfuric acid, hydrofluoric acid, citric acid, or other chemical reagents. Finally, depending on requirements, processes such as etching or dicing are performed to obtain a plurality of unitized light-emitting devices.

Figure 9:
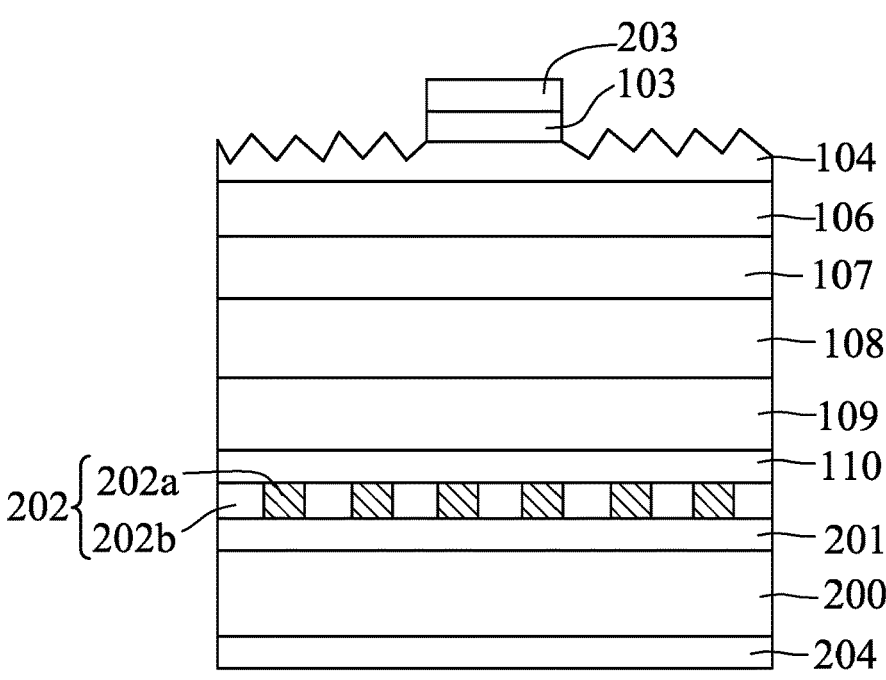
FIG. 9 is a schematic view illustrating a third embodiment of the light-emitting device according to the disclosure.

FIG. 9 illustrates a third embodiment of the light-emitting device according to the disclosure. The light-emitting device includes the substrate 200, the semiconductor epitaxial structure, and the bonding layer 201 bonding the semiconductor epitaxial structure to the substrate 200. The semiconductor epitaxial structure includes the second ohmic contact layer 110, the second current spreading layer 109, the second cladding layer 108, the active layer 107, the first cladding layer 106, the first current spreading layer 104, and the first ohmic contact layer 103 sequentially disposed on the substrate 200 in such order in the bottom-top direction.

In some embodiments, the first current spreading layer 104 is made of gallium arsenide, has a thickness ranging from 2 μm to 10 μm, and has a doping concentration ranging from $1E17/cm^3$ to $4E18/cm^3$. Gallium arsenide has a bandgap of 1.42 eV and may absorb light having a peak wavelength no greater than 870 nm, and therefore may resolve the issue of red burst in the light-emitting device.

In other embodiments, the second current spreading layer 109 is made of gallium arsenide, has a thickness ranging from 0 μm to 3 μm, and has a doping concentration ranging from $1E17/cm^3$ to $4E18/cm^3$. Having the second current spreading layer 109 being made of gallium arsenide may further resolve the issue of red burst in the light-emitting device and expand applications thereof.

Figure 10:
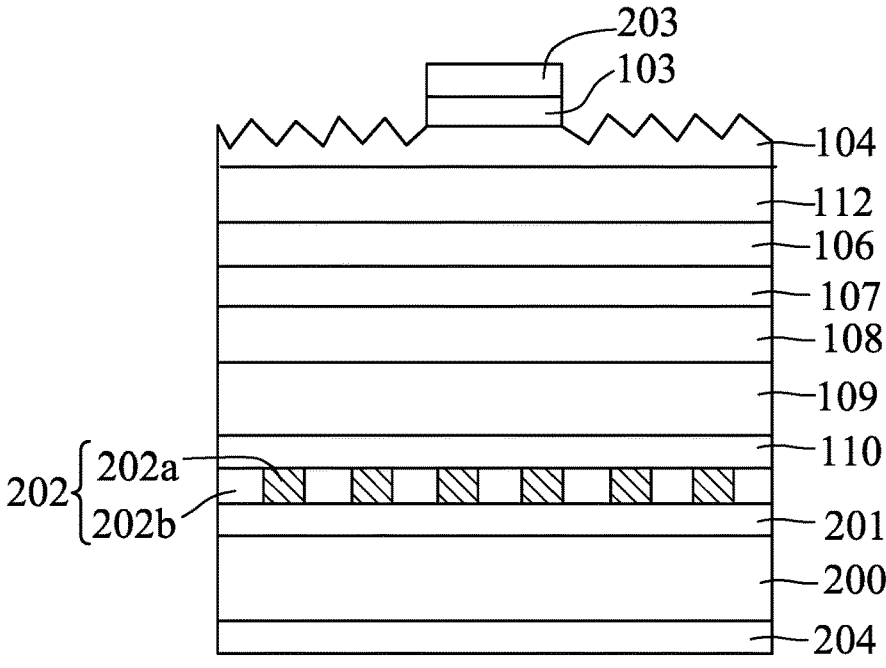
FIG. 10 is a schematic view illustrating a fourth embodiment of the light-emitting device according to the disclosure.

FIG. 10 illustrates a fourth embodiment of the light-emitting device according to the disclosure. Referring to FIG. 10, the light-emitting device includes the substrate 200, the semiconductor epitaxial structure, and the bonding layer 201 bonding the semiconductor epitaxial structure to the substrate 200. The semiconductor epitaxial structure includes the second ohmic contact layer 110, the second current spreading layer 109, the second cladding layer 108, the active layer 107, the first cladding layer 106, a layered stack 112, the first current spreading layer 104, and the first ohmic contact layer 103 sequentially disposed on the substrate 200 in such order in the bottom-top direction. The layered stack 112 includes an $In_{x3}Ga_{1-x3}As$ layer and an $Al_{y3}Ga_{1-y3}As_zP_{1-z}$ layer, in which $0.02 < x_3 \le 0.20$, $0 \le y_3 \le 0.25$, and $0.7 < z \le 0.95$.

In some embodiments, the layered stack 112 is formed out of N pairs of $In_{x3}Ga_{1-x3}As$ and $Al_{y3}Ga_{1-y3}As_zP_{1-z}$ layers that are alternately stacked on one another, where $1 \le N \le 20$. In certain embodiments, in the layered stack 112, each of the $In_{x3}Ga_{1-x3}As$ layers has a thickness ranging from 5 nm to 20 nm, and each of the $Al_{y3}Ga_{1-y3}As_zP_{1-z}$ layers has a thickness ranging from 5 nm to 50 nm.

In this embodiment, the layered stack 112 absorbs visible light emitted by the light-emitting device. By alternately stacking the $In_{x3}Ga_{1-x3}As$ layers and the $Al_{y3}Ga_{1-y3}As_zP_{1-z}$ layers, the light-emitting device may alleviate stress resulted from lattice mismatch between the $In_{x3}Ga_{1-x3}As$ layer and the growth substrate 100, and therefore improving the growth quality of lattice of the semiconductor epitaxial structure and improving optoelectronic properties of the light-emitting device.

In summary, by adopting the gallium arsenide layer and the $In_{x1}Ga_{1-x1}As$ layer as absorption layers, under the condition that a current density of the light-emitting device is greater than 1 $A/mm^2$, visible light may effectively be eliminated, thereby alleviating the issue of red burst in the light-emitting device. In addition, the first indium-containing transition layer 105 and the second indium-containing transition layer 111a may serve to improve the lattice quality of the semiconductor epitaxial structure. Therefore, optoelectronic properties and reliability of the light-emitting device are improved, and the purpose of this disclosure is achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:

a semiconductor epitaxial structure that has a first surface and a second surface opposite to said first surface, and that includes a first current spreading layer, a first $In_{x1}Ga_{1-x1}As$ layer, a first cladding layer, an active layer and a second cladding layer disposed sequentially in such order from said first surface to said second surface, wherein, in said first $In_{x1}Ga_{1-x1}As$ layer, $0<x1\leq0.08$, wherein said semiconductor epitaxial structure further includes a second current spreading layer that is disposed on said second cladding layer opposite to said active layer and that has a composition represented by $Al_{y2}Ga_{1-y2}As$, and $0\leq y2\leq0.25$.

2. The light-emitting device of claim 1, wherein said first $In_{x1}Ga_{1-x1}As$ layer has a thickness ranging from 100 nm to 1000 nm, and has a doping concentration ranging from $1E17/cm^3$ to $4E18/cm^3$.

3. The light-emitting device of claim 1, wherein said first current spreading layer has a composition represented by $Al_{y1}Ga_{1-y1}As$, and $0\leq y1\leq0.25$.

4. The light-emitting device of claim 3, wherein said first current spreading layer has a thickness ranging from 2 μm to 10 μm, and has a doping concentration ranging from $1E17/cm^3$ to $4E18/cm^3$.

5. The light-emitting device of claim 1, wherein said semiconductor epitaxial structure further includes a first indium-containing transition layer that is disposed between said first current spreading layer and said first $In_{x1}Ga_{1-x1}As$ layer and that has an indium content which increases in a direction from said first current spreading layer to said first $In_{x1}Ga_{1-x1}As$ layer.

6. The light-emitting device of claim 5, wherein the indium content of said first indium-containing transition layer increases in the direction from said first current spreading layer to said first $In_{x1}Ga_{1-x1}As$ layer in a linear manner.

7. The light-emitting device of claim 5, wherein the indium content of said first indium-containing transition layer increases in the direction from said first current spreading layer to said first $In_{x1}Ga_{1-x1}As$ layer in a stepwise manner.

8. The light-emitting device of claim 1, wherein said second current spreading layer has a thickness that is greater than 0 μm and that is not greater than 3 μm, and has a doping concentration ranging from $1E17/cm^3$ to $4E18/cm^3$.

9. The light-emitting device of claim 1, wherein said semiconductor epitaxial structure further includes a second $In_{x2}Ga_{1-x2}As$ layer disposed between said second cladding layer and said second current spreading layer, and $0<x2\leq0.08$.

10. The light-emitting device of claim 9, wherein said second $In_{x2}Ga_{1-x2}As$ layer has a thickness ranging from 100 nm to 1000 nm, and has a doping concentration ranging from $1E17/cm^3$ to $4E18/cm^3$.

11. The light-emitting device of claim 9, wherein said semiconductor epitaxial structure further includes a second indium-containing transition layer that is disposed between said second cladding layer and said second $In_{x2}Ga_{1-x2}As$ layer and that has an indium content which increases in a direction from said second cladding layer to said second $In_{x2}Ga_{1-x2}As$ layer.

12. The light-emitting device of claim 11, wherein the indium content of said second indium transition layer increases in the direction from said second cladding layer to said second $In_{x2}Ga_{1-x2}As$ layer in a linear manner.

13. The light-emitting device of claim 11, wherein the indium content of said second indium transition layer increases in the direction from said second cladding layer to said second $In_{x2}Ga_{1-x2}As$ layer in a stepwise manner.

14. The light-emitting device of claim 1, wherein said light-emitting device emits invisible light having a peak wavelength ranging from 910 nm to 980 nm.

15. A light-emitting device, comprising:

a semiconductor epitaxial structure that has a first surface and a second first-surface opposite to said first surface, and that includes a first current spreading layer, a first cladding layer, an active layer and a second cladding layer disposed sequentially in such order from said first surface to said second surface, wherein, said first current spreading layer is made of gallium arsenide, has a thickness ranging from 2 μm to 10 μm, and has a doping concentration ranging from $1E17/cm^3$ to $4E18/cm^3$, wherein said semiconductor epitaxial structure further includes a second current spreading layer that is disposed on said second cladding layer opposite to said active layer and that has a composition represented by $Al_{y2}Ga_{1-y2}As$, and $0\leq y2<0.25$.

16. The light-emitting device of claim 15, wherein said second current spreading layer has a thickness greater than 0 μm and not greater than 3 μm, and has a doping concentration ranging from $1E17/cm^3$ to $4E18/cm^3$.

17. A light-emitting device, comprising:

a semiconductor epitaxial structure that has a first surface and a second surface opposite to said first surface, and that includes a first current spreading layer, a layered stack, a first cladding layer, an active layer and a second cladding layer disposed sequentially in such order from said first surface to said second surface, wherein said layered stack includes an $In_{x3}Ga_{1-x3}As$ layer and an $Al_{y3}Ga_{1-y3}As_zP_{1-z}$ layer, in which $0.02<x3<0.20$, $0\leq y3\leq0.25$, and $0.7<z\leq0.95$.

18. The light-emitting device of claim 17, wherein said layered stack includes N pairs of said $In_{x3}Ga_{1-x3}As$ and $Al_{y3}Ga_{1-y3}As_zP_{1-z}$ layers that are alternately stacked on one another, and $2\leq N\leq20$.

19. The light-emitting device of claim 18, wherein each of said $In_{x3}Ga_{1-x3}As$ layers has a thickness ranging from 5 nm to 20 nm, and each of said $Al_{y3}Ga_{1-y3}As_zP_{1-z}$ layers has a thickness ranging from 5 nm to 50 nm.

* * * * *